(12) United States Patent
Pitkänen et al.

(10) Patent No.: US 9,448,761 B2
(45) Date of Patent: Sep. 20, 2016

(54) METHOD AND APPARATUS FOR PROVIDING AUDIO-BASED CONTROL

(75) Inventors: Jukka Tapani Pitkänen, Kaarina (FI); Jani Petteri Väre, Kaarina (FI)

(73) Assignee: Nokia Technologies Oy, Espoo (FI)

( * ) Notice: Subject to any disclaimer, the term of this patent is extended or adjusted under 35 U.S.C. 154(b) by 1157 days.

(21) Appl. No.: 13/173,850

(22) Filed: Jun. 30, 2011

(65) Prior Publication Data

US 2013/0006404 A1 Jan. 3, 2013

(51) Int. Cl.
*G06F 17/00* (2006.01)
*G06F 3/16* (2006.01)
*H03G 3/32* (2006.01)
*H04N 21/439* (2011.01)

(52) U.S. Cl.
CPC .............. *G06F 3/165* (2013.01); *G06F 3/167* (2013.01); *H03G 3/32* (2013.01); *H04N 21/439* (2013.01)

(58) Field of Classification Search
USPC ........................... 700/94; 381/58–61, 98–109
See application file for complete search history.

(56) References Cited

U.S. PATENT DOCUMENTS

| 5,506,910 | A * | 4/1996 | Miller ...................... H03G 3/32 381/103 |
| 2003/0200001 | A1* | 10/2003 | Goddard ......................... 700/94 |
| 2004/0117442 | A1 | 6/2004 | Thielen |
| 2006/0089176 | A1 | 4/2006 | Oki |
| 2008/0015717 | A1 | 1/2008 | Griffin, Jr. et al. |
| 2009/0258677 | A1 | 10/2009 | Ellis et al. |
| 2010/0260350 | A1 | 10/2010 | Chutorash et al. |
| 2011/0046816 | A1 | 2/2011 | Daly et al. |
| 2012/0197648 | A1* | 8/2012 | Moloney ....................... 704/500 |

FOREIGN PATENT DOCUMENTS

CN 2842954 11/2006

OTHER PUBLICATIONS

"Apple Wants to Patent Pushing a UI to an External Device" Written by: 8bitjay on Nov. 19, 2010, http://www.ismashphone.com/2010/11/apple-wants-to-patent-pushing-a-ui-to-an-external-device.html.
Harmon/Kardon Innovation, Retrieved: Dec. 22, 2011, http://www.automotive.harmankardon.com/en/innovations/dvcgal.aspx.
Parrot CK3100 Bluetooth Handfree Car Kit, ICEbuyer, Retrieved: Dec. 22, 2011, http://www.icebuyer.com/ck3100-bluetooth-handsfree-p-12346.html.

* cited by examiner

*Primary Examiner* — Fan Tsang
*Assistant Examiner* — David Siegel
(74) *Attorney, Agent, or Firm* — Ditthavong & Steiner, P.C.

(57) ABSTRACT

An approach is provided for providing audio-based control for at least one device based on changes in the rendering of audio information. A control platform causes, at least in part, a transmission of audio information from at least one device to an audio playback assembly for rendering. The control platform further determines at least one indication of a change in the rendering, wherein the at least one indication is based, at least in part, on one or more controls associated with the audio playback assembly. The control platform also processes and/or facilitates a processing of the at least one indication to cause, at least in part, an execution of at least one function for controlling the rendering of the audio information.

18 Claims, 11 Drawing Sheets

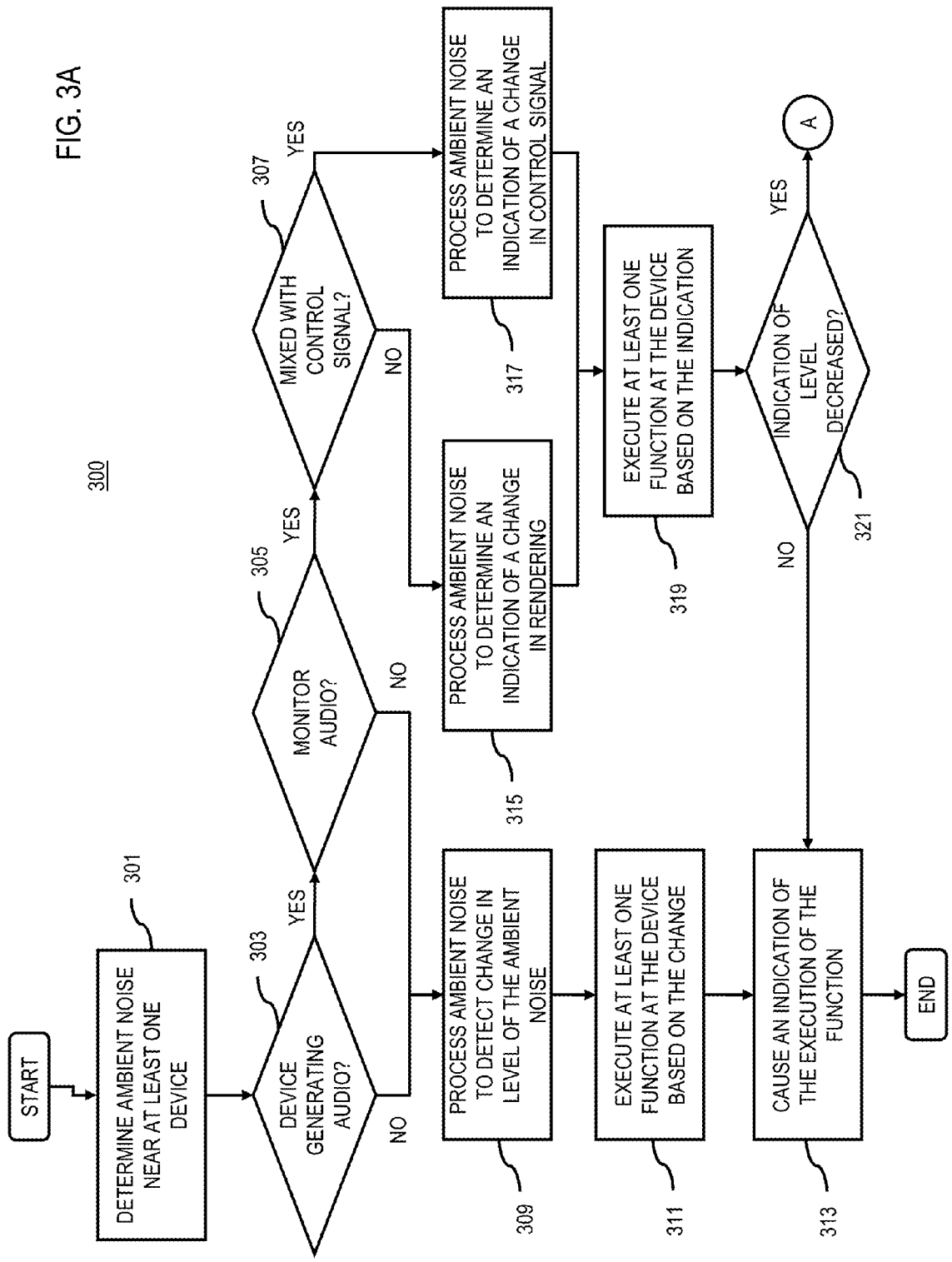

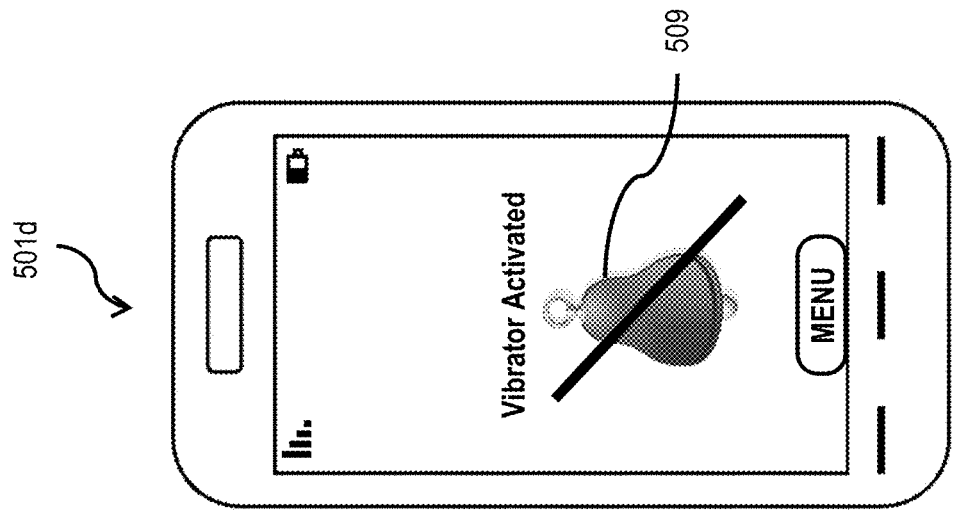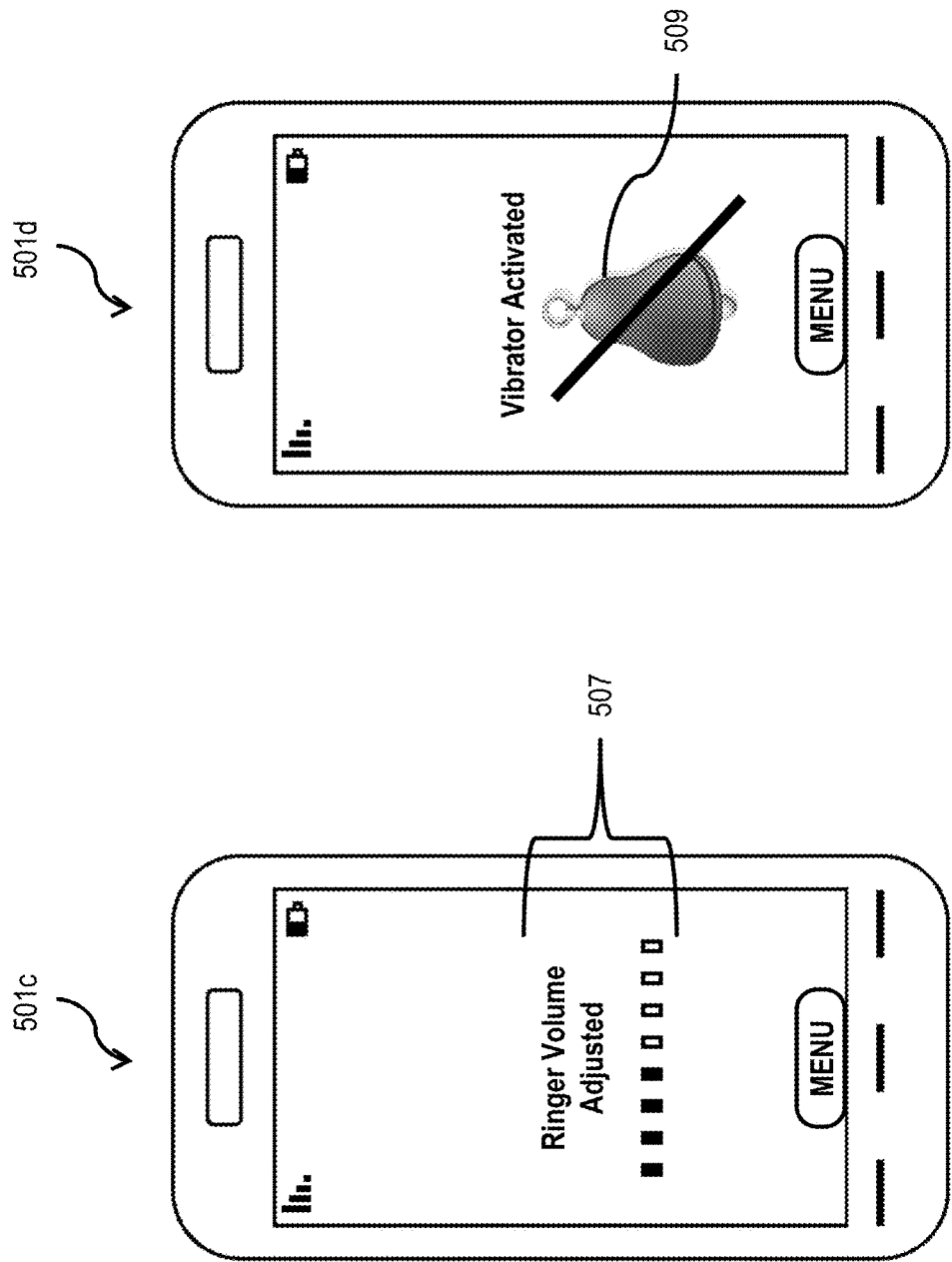
FIG. 5D
FIG. 5C

METHOD AND APPARATUS FOR PROVIDING AUDIO-BASED CONTROL

BACKGROUND

Service providers and device manufacturers (e.g., wireless, cellular, etc.) are continually challenged to deliver value and convenience to consumers by, for example, providing compelling network services. As devices become more sophisticated, the devices are able to perform more functions and interact with more services than ever before. However, control over the functions has become increasingly complex requiring more of the consumers' attention to browse multiple screens to execute, for example, just one function. One such function is playing music stored on the devices or streamed to the devices from one or more music streaming services. Consumers can now play music from their devices while performing various activities. Certain activities, such as driving a car, should be the primary focus of the consumers rather than controlling the devices to, for example, change streams, change songs or fast forward or pause the music. However, mechanisms do not currently exist that allow control over the devices without direct contact with the devices or without intensive processing required for voice activation/control. As such, service providers and device manufacturers face significant technical challenges to providing mechanisms for controlling devices.

SOME EXAMPLE EMBODIMENTS

Therefore, there is a need for an approach for providing audio-based control of devices.

According to one embodiment, a method comprises causing, at least in part, a transmission of audio information from at least one device to an audio playback assembly for rendering. The method also comprises determining at least one indication of a change in the rendering, wherein the at least one indication is based, at least in part, on one or more controls associated with the audio playback assembly. The method further comprises processing and/or facilitating a processing of the at least one indication to cause, at least in part, an execution of at least one function for controlling the rendering of the audio information.

According to another embodiment, an apparatus comprises at least one processor, and at least one memory including computer program code for one or more computer programs, the at least one memory and the computer program code configured to, with the at least one processor, cause, at least in part, the apparatus to transmit audio information from at least one device to an audio playback assembly for rendering. The apparatus is also caused to determine at least one indication of a change in the rendering, wherein the at least one indication is based, at least in part, on one or more controls associated with the audio playback assembly. The apparatus is further caused to process and/or facilitate a processing of the at least one indication to cause, at least in part, an execution of at least one function for controlling the rendering of the audio information.

According to another embodiment, a computer-readable storage medium carries one or more sequences of one or more instructions which, when executed by one or more processors, cause, at least in part, an apparatus to transmit audio information from at least one device to an audio playback assembly for rendering. The apparatus is also caused to determine at least one indication of a change in the rendering, wherein the at least one indication is based, at least in part, on one or more controls associated with the audio playback assembly. The apparatus is further caused to process and/or facilitate a processing of the at least one indication to cause, at least in part, an execution of at least one function for controlling the rendering of the audio information.

According to another embodiment, an apparatus comprises means for causing, at least in part, a transmission of audio information from at least one device to an audio playback assembly for rendering. The apparatus also comprises means for determining at least one indication of a change in the rendering, wherein the at least one indication is based, at least in part, on one or more controls associated with the audio playback assembly. The apparatus further comprises means for processing and/or facilitating a processing of the at least one indication to cause, at least in part, an execution of at least one function for controlling the rendering of the audio information.

In addition, for various example embodiments of the invention, the following is applicable: a method comprising facilitating a processing of and/or processing (1) data and/or (2) information and/or (3) at least one signal, the (1) data and/or (2) information and/or (3) at least one signal based, at least in part, on (including derived at least in part from) any one or any combination of methods (or processes) disclosed in this application as relevant to any embodiment of the invention.

For various example embodiments of the invention, the following is also applicable: a method comprising facilitating access to at least one interface configured to allow access to at least one service, the at least one service configured to perform any one or any combination of network or service provider methods (or processes) disclosed in this application.

For various example embodiments of the invention, the following is also applicable: a method comprising facilitating creating and/or facilitating modifying (1) at least one device user interface element and/or (2) at least one device user interface functionality, the (1) at least one device user interface element and/or (2) at least one device user interface functionality based, at least in part, on data and/or information resulting from one or any combination of methods or processes disclosed in this application as relevant to any embodiment of the invention, and/or at least one signal resulting from one or any combination of methods (or processes) disclosed in this application as relevant to any embodiment of the invention.

For various example embodiments of the invention, the following is also applicable: a method comprising creating and/or modifying (1) at least one device user interface element and/or (2) at least one device user interface functionality, the (1) at least one device user interface element and/or (2) at least one device user interface functionality based at least in part on data and/or information resulting from one or any combination of methods (or processes) disclosed in this application as relevant to any embodiment of the invention, and/or at least one signal resulting from one or any combination of methods (or processes) disclosed in this application as relevant to any embodiment of the invention.

In various example embodiments, the methods (or processes) can be accomplished on the service provider side or on the mobile device side or in any shared way between service provider and mobile device with actions being performed on both sides.

For various example embodiments, the following is applicable: An apparatus comprising means for performing a method of any of the claims.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings:

FIGS. 3A and 3B are flowcharts of a process for providing audio-based control, according to one embodiment;

FIGS. 5A-5D are diagrams of user interfaces utilized in the processes of FIGS. 3A and 3B, according to various embodiments;

DESCRIPTION OF SOME EMBODIMENTS

Examples of a method, apparatus, and computer program for providing audio-based control of devices are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
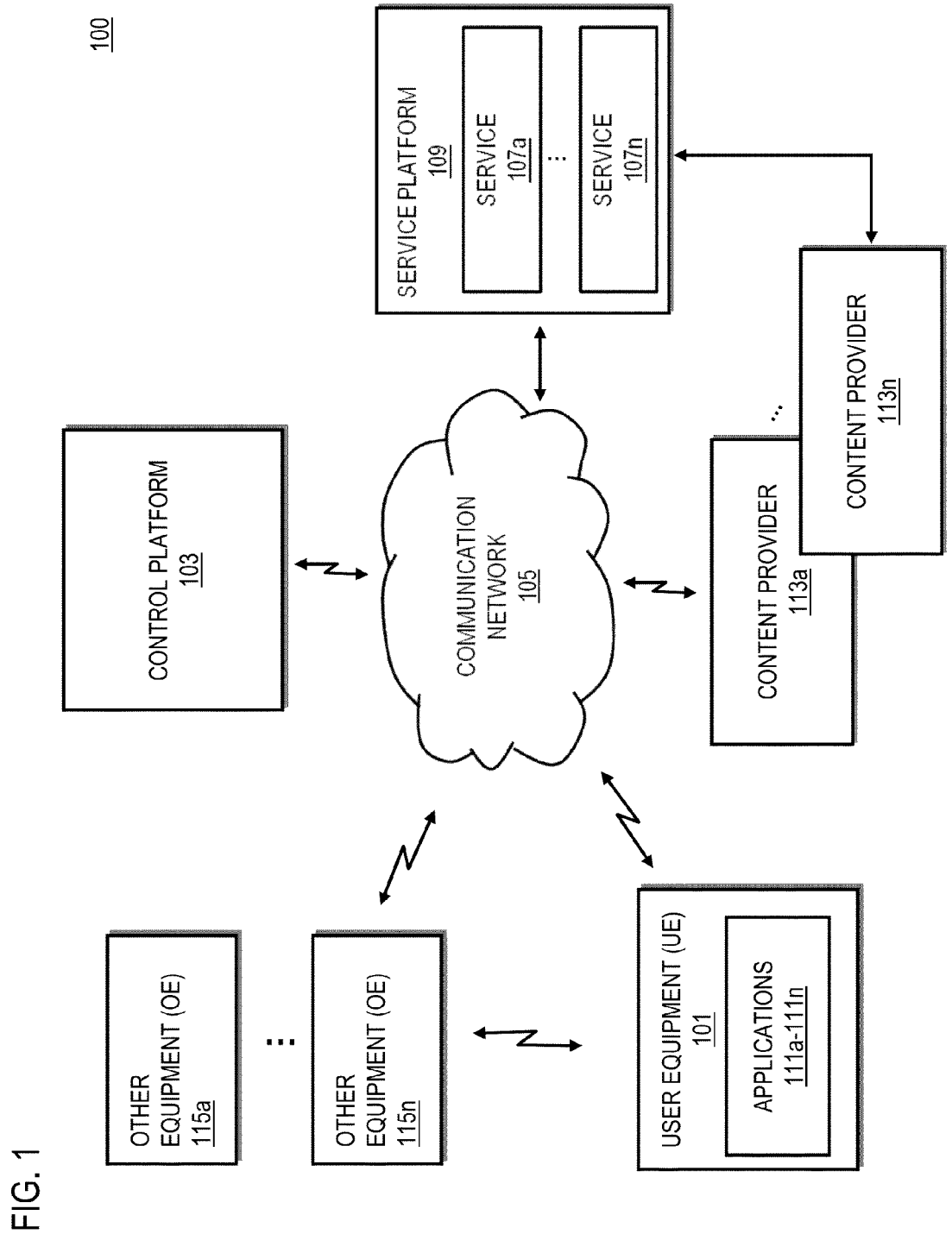
FIG. 1 is a diagram of a system capable of providing audio-based control, according to one embodiment.

FIG. 1 is a diagram of a system capable of providing audio-based control, according to one embodiment. As discussed above, modern devices are increasingly more sophisticated and have the ability to perform a variety of different functions. For example, modern devices have the functionality to play digital music stored on the devices, interface with service providers through networks that provide streaming digital music and/or use built-in tuners to tune to radio stations that broadcast music. This functionality allows users of the devices to listen to music in almost any setting. However, in some settings, listening to, and controlling playback of, the music is not the primary task. For example, users often play music using their devices while driving a car. In such situations, driving the car is the primary task of the user and listening to music using the device is the secondary task. In certain geographic locations (e.g., jurisdictions, cities, countries, etc.), even touching the devices to control the music playback (e.g., pausing, fast forwarding, rewinding, advancing to the next song, etc.) is prohibited because of the emphasis on driving as the primary responsibility.

Certain other situations exist where controlling music playback is not legally prohibited but is instead prohibitively complex or difficult because of the location of the device generating the music, or the music signal, relative to the user. For example, a user may be playing digital music stored on a device through a home entertainment system. The user may be far away from the device and thus be unable to control the playback of the music using the controls on the device. However, the user may have access to a remote control associated with the home entertainment system that controls, for example, the volume of the music playing through the home entertainment system from anywhere with line-of-sight to the receiver of the home entertainment system. Alternatively, the user may be driving in a car that has volume controls on the steering wheel that are more easily accessible than the device. Alternatively, the user may not have access to a remote control but would still like to control the playback of the music through the home entertainment system without physically controlling the device. For example, the user may want to control the volume of the music based on the level of the ambient noise near the device.

Yet other situations exist where the user would like a simpler way to control the functionality of the device without having to browse through multiple different configuration or settings screens. For example, on some devices, to adjust the volume of the ringer and/or switch the ringer off and the vibrator on, the user must navigate through one or more settings screens to access and change the settings on the device. Alternatively, or in addition, the phone may have buttons that allow for a more direct way of controlling the ringer and/or vibrator. Yet, these controls still require the user to have the device in their physical possession and directly operate the buttons to change the functionality of the phone.

To address these problems, a system 100 of FIG. 1 introduces the capability to provide audio-based control of functionality of a device based on the level of ambient noise near the device. The system 100 provides for a method of controlling the functionality of a device (e.g., switching applications, controlling music playback, using text-to-speech for reading emails and/or texts, controlling ringer/vibrator functionality, etc.) based on the level of ambient noise near the device. By way of example, an audio system is setup to play music in a room, and the volume of the music is controlled using the system 100 such that the volume corresponds to a set relation as compared to the level of ambient noise in the room. Such capability allows music to be played from the device during periods of silence or low noise levels (e.g., low levels of talking, no talking) in the room, and allows music not to be played from the device during periods of higher levels of noise in the room.

The system 100 also introduces the capability to provide audio-based control of functionality of a device based on the level of rendered audio information constituting part of the ambient noise where the audio information originates from the device (e.g., where the device is emitting the audio information as audio or causing another device to emit the audio information as audio). By way of example, certain durations, degrees, rates, patterns, or combinations thereof in the change of the level of the rendered audio information by an audio playback assembly (e.g., a car stereo, a home entertainment system, a television, a computer) can correspond to certain functionality of controlling the music or other functionality of the device that is transmitting the audio information to the audio playback assembly. For example, muting the music can correspond to pausing the playback of the current song, muting the music for less than a certain time period can correspond to advancing to the next song, and so forth.

The system 100 also introduces the capability to provide audio-based control of functionality of a device based on the level of at least one control signal included within the rendered audio information. In one embodiment, the system 100 provides for a method of controlling, for example, music played by a device based on the level of a control signal that is mixed with the music. To not interfere with the user's enjoyment of the music, the control signal can be outside the frequency range of human hearing such that the control signal is inaudible to humans. Alternatively, the control signal can be within the frequency range of human hearing but at low levels to be substantially inaudible to humans. As discussed above, certain durations, degrees, rates, patterns, or combinations thereof in the change of the level of the control signal can correspond to certain functionality of controlling the music or other functionality of the device.

As shown in FIG. 1, the system 100 comprises a user equipment (UE) 101 having connectivity to a control platform 103 via a communication network 105. The UE 101 can include one or more applications 111a-111n (collectively referred to as applications 111) that can perform various functions (e.g., audio applications, mapping applications, messaging applications, calendar applications, context applications, sensor applications, etc.). The applications 111 can also control the configuration and/or settings of the UE 101.

The system 100 also includes one or more other equipment (OE) 115a-115n (collectively referred to as OE 115). The OE 115 can be any type of audio playback assembly device that can interface with the UE 101, the control platform 103, the service platform 109 and/or the content providers 113. By way of example, the OE 115 can include a stereo, a home entertainment system, an automobile, an automobile stereo, a portable music device, a microphone, an audio/visual device, a computer, a television, etc. As illustrated in FIG. 1, the OE 115 can communicate with the UE 101 through the communication network 105 or through a direct connection (e.g., analog cable, digital cable, proprietary cable, etc.).

The system 100 also includes a service platform 109 that includes one or more services 107a-107n (collectively referred to as services 107) that can provide various services and/or perform various functionality (e.g., audio/music based services, location based services, mapping information, social networking services, etc.). By way of example, one music-based service can include streaming music through the communication network 105 to the UE 101 and/or the OE 115.

The system 100 also includes one or more content providers 113a-113n (collectively referred to as content providers 113) that can provide content to the services 107 of the service platform 109, the control platform 103, the UE 101, the OE 115, or a combination thereof. By way of example, the content providers 113 can provide the streaming music content to the services 107 for streaming to the UE 101 and/or the OE 115.

In one embodiment, as illustrated in FIG. 1, the control platform 103 is a separate, distinct element of the system 100. In one embodiment, the control platform 103 can be embodied in one or more applications 111 running on the UE 101. In one embodiment, the control platform 103 can be embodied in one or more hardware modules of the UE 101 or the OE 115. In one embodiment, the control platform 103 can be embodied in one or more services 107 of the service platform 109. In one embodiment, the control platform 103 can be embodied in one or more content providers 113.

By way of example, the communication network 105 of system 100 includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (WiFi), wireless LAN (WLAN), Bluetooth®, Internet Protocol (IP) data casting, satellite, mobile ad-hoc network (MANET), and the like, or any combination thereof.

The UE 101 is any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, television receiver, radio broadcast receiver, electronic book device, game device, or any combination thereof, including the accessories and peripherals of these devices, or any combination thereof. It is also contemplated that the UE 101 can support any type of interface to the user (such as "wearable" circuitry, etc.).

By way of example, the UE 101, the control platform 103, the service platform 109, the content providers 113 and the OE 115 can communicate with each other and other components of the communication network 105 using well known, new or still developing protocols. In this context, a protocol includes a set of rules defining how the network nodes within the communication network 105 interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model.

Communications between the network nodes are typically effected by exchanging discrete packets of data. Each packet typically comprises (1) header information associated with a particular protocol, and (2) payload information that follows the header information and contains information that may be processed independently of that particular protocol. In some protocols, the packet includes (3) trailer information following the payload and indicating the end of the payload information. The header includes information such as the source of the packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a packet traversing multiple heterogeneous networks, such as the Internet, typically include a physical (layer 1) header, a data-link (layer 2) header, an internetwork (layer 3) header and a transport (layer 4) header, and various application (layer 5, layer 6 and layer 7) headers as defined by the OSI Reference Model.

Figure 2:
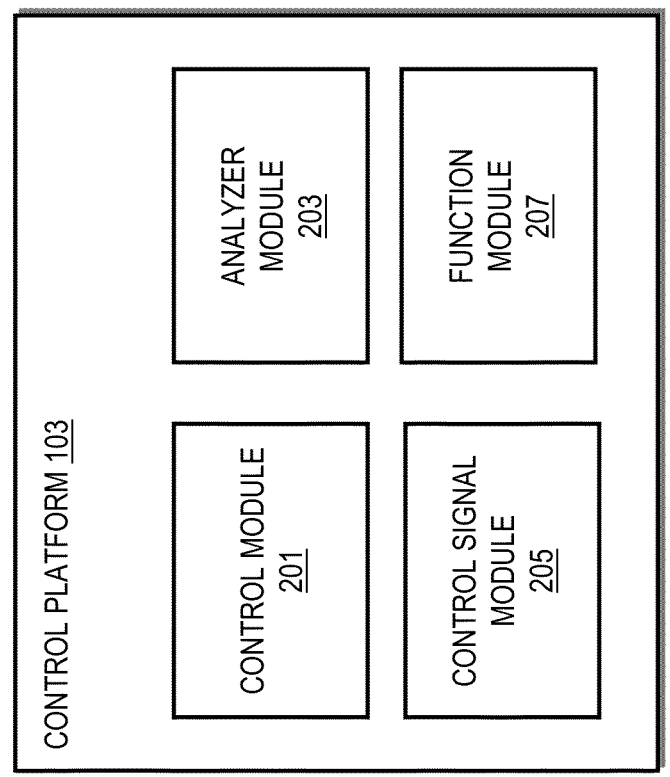
FIG. 2 is a diagram of the components of an audio-based control platform, according to one embodiment.

FIG. 2 is a diagram of the components of the control platform 103, according to one embodiment. By way of example, the control platform 103 includes one or more components for providing audio-based control. It is contemplated that the functions of these components may be combined in one or more components or performed by other components of equivalent functionality. In this embodiment, the control platform 103 includes a control module 201, an analyzer module 203, a control signal module 205 and a function module 207.

The control module 201 includes one or more algorithms that control the actions of the control platform 103. The control module 201 receives ambient noise from the UE 101, one or more of the OE 115, one or more services 107, one or more content providers 113, or a combination thereof for controlling the functionality of at least one controlled device (e.g., the UE 101 or one or more of the OE 115). By way of example, a user operates an application 111a running on the UE 101 to generate a request for control over the UE 101 by the control platform 103, and the UE 101, or a different device (e.g., OE 115), begins detecting the ambient noise surrounding the UE 101. The UE 101 or the OE 115 can automatically begin detecting the ambient noise, or can begin detecting the ambient noise at the request of the control module 201. The UE 101 also determines whether the UE 101 or one or more of the OE 115 are rendering audio information that constitutes part of the ambient noise upon generating the request, or upon receiving a request from the control module 201 for such a determination. The request, along with the ambient noise, is sent to the control platform 103 over the communication network 105. Alternatively, the request and the ambient noise can be sent to the control platform 103 through any direct connection (e.g., analog, digital, and/or proprietary connection). In one embodiment, where the UE 101 transmits music that is rendered by one or more OE 115, the control module 201 causes the UE 101 to begin transmitting the audio information to one or more OE 115 to begin rendering the audio information.

In one embodiment, the analyzer module 203 processes the ambient noise received at the control platform 103 to determine the level of the ambient noise using one or more algorithms. The analyzer module 203 also processes the level of the ambient noise to determine changes in the level of the ambient noise. The changes can be in the duration, degree, rate, pattern, or combination thereof of the level of the ambient noise.

In one embodiment, the analyzer module 203 processes the ambient noise received at the control platform 103 to determine the level of rendered audio information that constitutes part of the ambient noise using one or more algorithms. As discussed above, the controlled device (e.g., UE 101 or OE 115) or another device (e.g., UE 101 or OE 115) connected to the controlled device can render audio information that constitutes part of the ambient noise. The rendered audio information can constitute one or more audio signals that are rendered (e.g., played) by the UE 101 or one or more of the OE 115. The audio information can correspond to any type of audio, including, music, speech, etc. The analyzer module 203 can analyze solely the rendered audio information within the ambient noise to determine the level of the rendered audio information and/or the one or more changes in the rendering of the audio information. The analyzer module 203 can include one or more audio filters that can filter out white noise or average background noise to focus on the audio information. The analyzer module 203 can also receive the audio information from the device that is generating the audio information to compare the audio information with the ambient noise to filter out other noise and focus solely on the audio information.

In one embodiment, the analyzer module 203 processes the ambient noise received at the control platform 103 to determine the level of a control signal within the rendered audio information using one or more algorithms. As discussed above, the controlled device (e.g., UE 101 or OE 115) or another device (e.g., UE 101 or OE 115) connected to the controlled device can be generating audio information or rendering audio information that constitutes part of the ambient noise. The audio information can include a control signal that is generated by the control platform 103, the controlled device or another device (discussed below) and mixed with the audio information. The analyzer module 203 can analyze solely the control signal within the ambient noise to determine a change in the level of the rendering of the control signal. The analyzer module 203 can include one or more audio filters that can filter out everything but the control signal so that the analyzer module 203 can determine the level of the control signal and the changes in the control signal.

In one embodiment, the analyzer module 203 can analyze any combination of the ambient noise, the audio information and the control signal to determine changes that correlate to functionality of a controlled device.

The control signal module 205 generates the control signal when the control platform 103 analyzes a control signal within the ambient noise to control the functionality of a controlled device. The control signal module 205 can generate an analog or digital audio control signal that is transmitted to the controlled device or the device that the controlled device is connected to that is rendering the audio information. Alternatively, the control signal module 205 can generate a specification or format for the control signal and transmit the specification or format to the controlled device or the device that the controlled device is connected to that is rendering the audio information so that the controlled device or device that is emitting the audio information can mix the control signal with the audio information. The control signal can correspond to an audio signal that is inaudible to humans such that, when the control signal is mixed and rendered with the audio information, the control signal is detectable by the control platform 103 as part of the ambient noise but cannot be detected by humans. For example, the control signal can correspond to a frequency outside of the frequency range of human hearing. Alternatively, the control signal can be audible to human hearing but at a substantially low level or played periodically to not distract from the audio signal.

The function module 207 correlates the change in the level of the ambient noise, audio information, and/or control signal to the corresponding function of the controlled device. When the analyzer module 203 detects a specific change in the ambient noise, the audio information, and/or control signal, the function module 207 determines the specific change and issues a command to the controlled device for executing the corresponding specific function. By way of example, when the analyzer module 203 determines that the level of the ambient noise near a UE 101 has increased above a certain threshold, the function module 207 determines to execute a function on the UE 101 to switch the ringer on the UE 101 from on to vibrate so that the user of the UE 101 can feel when the UE 101 receives an incoming phone call.

The function module 207 also instructs the controlled device and/or the device connected to the controlled device that is emitting sound to generate a different sound based on certain executed functionality. For example, where a UE 101 is connected to an OE 115 (e.g., a car stereo) and the UE 101 is streaming music that is being played through the OE 115, certain changes in the volume (e.g., muting the volume using the car's stereo) of the streaming music may correspond to the functionality of pausing and or stopping the music. In which case, the function module 207 instructs the UE 101 to generate an alternative sound that will be played through the car stereo such that, when there are changes in the volume (e.g., un-muting the volume using the car's stereo, increasing the volume, etc.), the alternative sound is detected by the UE 101 as part of the ambient sound and analyzed by the control platform 103 to begin the playback of the streaming music. The alternative sound can be any sound that is detectable by the control platform 103 as part of the ambient noise.

The function module 207 also instructs the controlled device (e.g., UE 101 or one or more OE 115) to indicate the functionality that was performed based on the changes in the ambient noise, the audio information, and/or control signal. For example, where a change in the ambient noise changes the level of the ringer of a UE 101, the function module 207 instructs the UE 101 to indicate a change in the level of the ringer. The function module 207 can instruct the UE 101 to perform the usual indication for the functionality defined by the settings of the controlled device, such as the usual indication for a change in the ringer volume, or the function module 207 can instruct the UE 101 to perform an additional indication for the functionality to indicate that the control was performed because of the control platform 103. The indication can be visual, audio, or a combination thereof.

Figure 7:
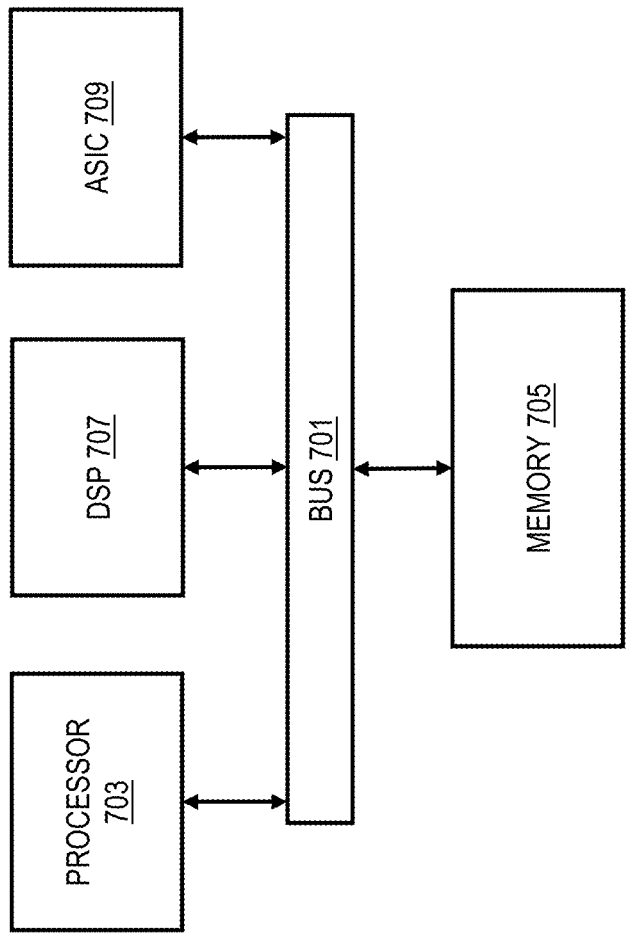
FIG. 7 is a diagram of a chip set that can be used to implement an embodiment of the invention.

FIG. 3 is a flowchart of a process for providing audio-based control, according to one embodiment. In one embodiment, the control platform 103 performs the process 300 and is implemented in, for instance, a chip set including a processor and a memory as shown in FIG. 7.

In step 301, the control platform 103 determines the ambient noise near at least one device. In one embodiment, the controlled device (e.g., UE 101) itself detects the ambient noise through, for example, a microphone in the device and sends the signal of the ambient noise to the control platform 103. In one embodiment, another device (e.g., OE 115), near the controlled device, detects the ambient noise near the controlled device and either sends a signal of the ambient noise directly to the control platform 103 or sends the signal to the controlled device, and the controlled device sends the signal to the control platform 103.

In step 303, the control platform 103 determines whether the controlled device or a device connected to the controlled device is generating audio information that is then rendered, thereby adding to the detected ambient noise. In one embodiment, the control platform 103 determines the presence of audio information based on a previous indication to cause a transmission of audio information from the controlled device to a device connected to the controlled device. If the controlled device or a device connected to the controlled device is generating audio information that is being rendered and adding to the ambient noise, the process 300 proceeds to step 305. If the controlled device or a device connected to the controlled device is not generating audio information, the process 300 proceeds to step 309.

At step 305, the control platform 103 determines whether to analyze the ambient noise generally, or whether to analyze the ambient noise focusing on the audio information that is generated by the controlled device or a device connected to the controlled device. If the control platform 103 determines to analyze the ambient noise focusing on the audio information, the process 300 proceeds to step 307. If the control platform 103 determines to analyze the ambient noise generally, the process proceeds to step 309.

At step 309, the control platform 103 processes the ambient noise to detect a change in the ambient noise. The control platform 103 can also detect a duration, a degree, a rate, a pattern, or a combination thereof in the change of the ambient noise. Upon detecting a change in the ambient noise that corresponds to a known type of change, the process 300 proceeds to step 311.

At step 311, the control platform 103 correlates the detected type of change in the ambient noise with a corresponding one or more functions to be executed by the controlled device. The control platform 103, by way of the function module 207, sends a signal to the controlled device to execute the corresponding one or more functions.

By way of example, a UE 101 running an application 111a that interfaces with the control platform 103 detects the ambient noise near the UE 101 and transmits the ambient noise to the control platform 103. Upon a change in the ambient noise, for example an increase in the ambient noise, the control platform 103 determines to increase the ringer volume of the UE 101 and transmits a signal to the UE 101 to increase the ringer volume. Accordingly, the UE 101 increases the ringer volume so that the user of the UE 101 can still hear the ringer upon receiving an incoming call despite the increase in ambient noise near the UE 101.

At step 313, the control platform 103 determines to indicate the execution of the functionality in step 311. The indication can be a visual or mechanical indication at the controlled device, or can be an audio indication at the controlled device or a device connected to the controlled device (e.g., a stereo that is playing music streaming to a controlled UE 101). By way of example, the UE 101 can beep as the ringer volume is increased or can vibrate as the ringer is turned off and the vibrator is turned on. After step 313, the process 300 ends or reverts to step 301.

As discussed above, if the control platform 103 determines to analyze the ambient noise focusing on the audio information, the process 300 proceeds to step 307. At step 307, the control platform 103 determines whether to analyze the ambient noise with the audio information focusing on the audio information generally, or on a control signal that has been mixed with the audio information. If the control platform 103 determines to analyze the ambient noise focusing on the audio information generally, the process 300 proceeds to step 315. If the control platform 103 determines to analyze the ambient noise focusing on the control signal mixed with the audio information, the process 300 proceeds to step 317.

At step 315, the control platform 103 determines at least one indication of a change in the rendering of the audio information. The control platform 103 can also detect a duration, a degree, rate, pattern, or a combination thereof in the indication of the change in the rendering. As discussed above, the control platform 103 can use one or more algorithms and/or filters to process the ambient noise to focus solely on the audio information. The control platform 103 can also receive a digital or analog version of the audio information that can be compared to the ambient noise to focus solely on the level of the audio information. Upon determining at least one indication of a change in the rendering of the audio information, the process 300 proceeds to step 319.

Alternatively, at step 317, the control platform 103 determines at least one indication of a change in the rendering of the control signal. The control platform 103 can also detect a duration, degree, rate, pattern, or a combination thereof in the indication of the change in the control signal. Because the control platform 103 determines the control signal using the control signal module 205, the control platform 103 can compare the control signal to the ambient noise to determine the control signal within the ambient noise. Upon determining at least one indication of a change in the rendering of the control signal, the process 300 proceeds to step 319.

At step 319, the control platform 103 correlates the detected type of indication with the corresponding one or more functions to be executed by the controlled device. The control platform 103, by way of the function module 207, sends a signal to the controlled device to execute the corresponding one or more functions.

By way of example, a UE 101 running an application 111a that interfaces with the control platform 103 detects the ambient noise and transmits the ambient noise to the control platform 103. In one embodiment, for example, the UE 101 is also running an application 111b that plays music streaming from a service 107a on the service platform 109. Within the music is a control signal (e.g., 60 kHz) generated by the control platform 103. Upon a change in the level of the control signal within the ambient noise, for example a decrease in the level of the control signal, the control platform 103 determines to pause the music playing on the UE 101 and transmits a signal to the UE 101 to pause the music. Accordingly, the UE 101 pauses the music.

At step 321, the control platform 103 determines whether the function executed by the controlled device involved pausing or otherwise stopping the rendering of audio information (e.g., stopping music playback) originating from the controlled device or a device connected to the controlled device. If the executed function involved stopping the rendering of audio information, the process proceeds to step 321. If the executed function did not involve stopping the rendering of audio information, the process proceeds to step 313 and performs the step as described above.

Figure 3B:
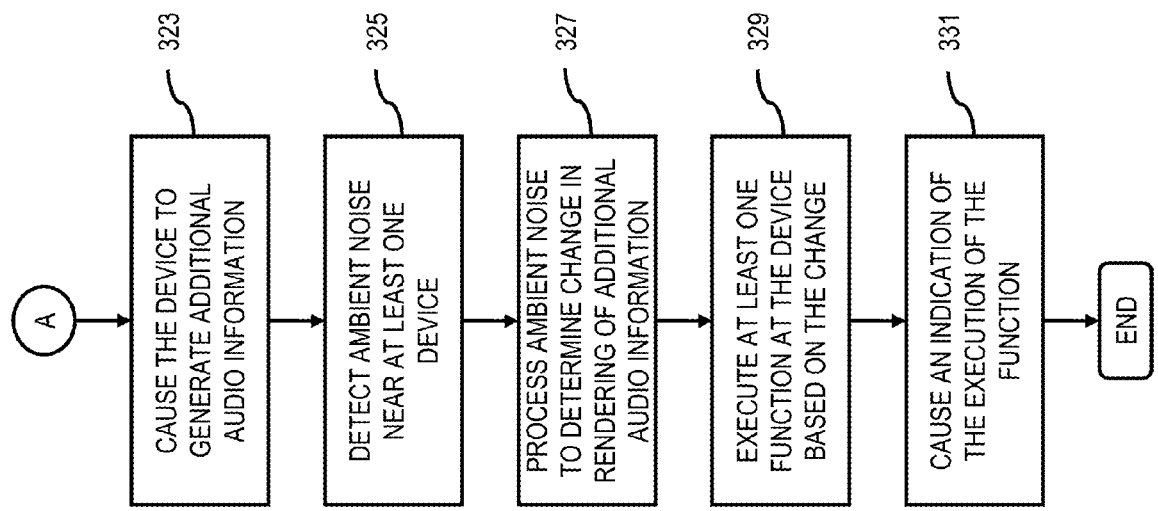

At step 323 of the process 300, illustrated in FIG. 3B, the control platform 103 determines to have the controlled device execute at least one additional function. The control platform 103 transmits a command for the controlled device to emit additional audio information, or cause another device to emit additional audio information (e.g., a stereo, a home entertainment system, etc.). The additional audio information can be different from the above-described audio information or control signal, or the additional audio information can be the same control signal. Because the level of the rendered audio information and/or the control signal decreased, as determined in step 321, the additional audio information is not actually rendered until the control of the level of the rendered audio information is increased. For example, where a decrease in the volume of the control signal corresponded to pausing playback of streaming music from a UE 101, the control platform 103 issues a command for the UE 101 to generate another sound can be detected once the control of the volume increases.

At step 325, the control platform 103 again determines the ambient noise near at least one device. As discussed above, in one embodiment, the controlled device itself detects the ambient noise through, for example, a microphone in the device and sends the signal of the ambient noise to the control platform 103. In one embodiment, another device, near the controlled device, detects the ambient noise near the controlled device and either sends a signal of the ambient noise directly to the control platform 103 or sends the signal to the controlled device, and the controlled device sends the signal to the control platform 103.

At step 327, the control platform 103 analyzes the ambient noise focusing on the additional audio information. The control platform 103 processes the ambient noise to detect an indication of a change in the rendering of the additional audio information within the ambient noise. The control platform 103 can also detect a duration, degree, rate, pattern, or combination thereof in the indication of the change in the rendering of the additional audio information. Upon detecting an indication of a change in the additional audio information that corresponds to a known type of change, the process 300 proceeds to step 329.

At step 329, the control platform 103 correlates the detected type of change in the additional audio information with the corresponding one or more functions to be executed by the controlled device. The control platform 103, by way of the function module 207, sends a signal to the controlled device to execute the corresponding one or more functions.

By way of example, where a UE 101 previously paused music playback because of a reduction in the volume of music being played back through an OE 115 connected to the UE 101 (e.g., an audio playback assembly, a car stereo), the UE 101 begins emitting the other audio signal. Upon an increase in the volume of the car stereo, the additional audio information is detectable by the control platform 103 as part of the ambient noise. Thus, the control platform 103 executes at least one additional function. By way of example, the control platform 103 issues a command for the UE 101 to stop generating the other audio signal and begin playback of the previously paused music.

At step 331, the control platform 103 determines to indicate the execution of the functionality in step 329. The indication can be an audio indication, a visual indication and/or mechanical indication at the controlled device or a device connected to the controlled device (e.g., a stereo that is playing music streaming from a controlled UE 101). After step 331, the process ends or reverts to step 301.

Figure 4B:
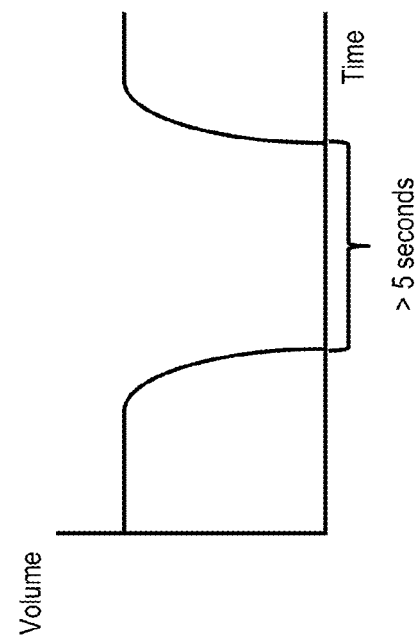
FIGS. 4A-4E are graphs of time versus volume relationships utilized in the processes of FIGS. 3A and 3B, according to various embodiments.
Figure 4D:
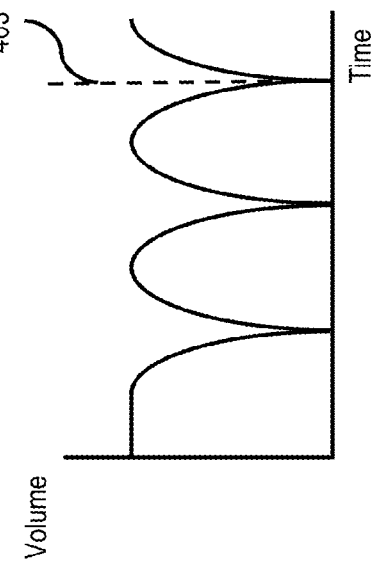
Figure 4A:
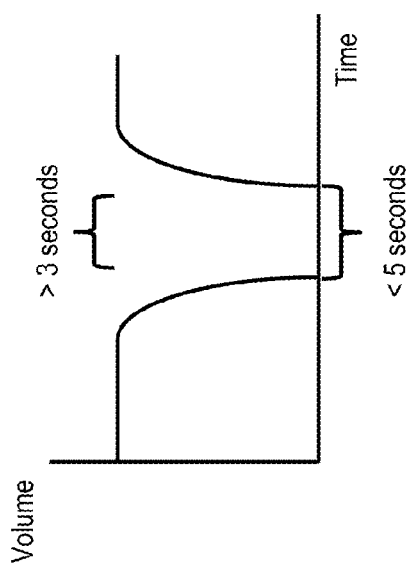

FIGS. 4A-4F are graphs of time versus volume illustrating the different changes in the level of the ambient noise, audio information, and/or control signal that can correspond to different functionality. FIG. 4A illustrates control of the functionality of a device based on the duration of the change in the level of the ambient noise, audio information, and/or control signal. By way of example, one device functionality can correspond to a reduction in the volume of audio information that lasts less than a threshold period of time. In FIG. 4A, the exemplary threshold period of time is five seconds; however, this threshold can be any period of time. Additionally, the functionality can correspond to an increase in the volume of the audio signal, rather than a decrease, that similarly lasts for less than a threshold period of time (e.g., less than five seconds). In one embodiment, one functionality can correspond to a decrease in the volume of the audio signal for less than the threshold duration of time, and a different functionality can correspond to an increase in the volume of the audio information for less than the same threshold period of time.

In one embodiment, where control of the functionality is based on a duration of the change in the ambient noise, audio information, and/or control signal, the duration must be at least greater than a certain threshold period of time to activate the control. As illustrated in FIG. 4A, the minimum threshold for the duration is three seconds. However, this threshold can be any value that prevents activation of the control based on, for example, pauses recorded in music being played by the controlled device. By way of example, brief pauses often occur after songs, even when the songs are part of a single album. The minimum threshold prevents these pauses from erroneously controlling the functionality of the device.

FIG. 4B also illustrates control over the functionality of a device based on the duration of the change in the level of the ambient noise, audio information, and/or control signal. By way of example, FIG. 4B illustrates a case where the duration lasts longer than a threshold period of time (e.g., greater than five seconds). Different functionality can correspond to greater and greater lengths of time. By way of example, where a UE 101 is playing music, muting (e.g., lowering the volume) the music for less than five seconds can correspond to repeating the song currently playing. Muting (e.g., lowering the volume) the music for more than five seconds can correspond to pausing the music playback. Muting (e.g., lowering the volume) the music for more than another threshold (e.g., ten seconds) can correspond to stopping the music playback.

Figure 4C:
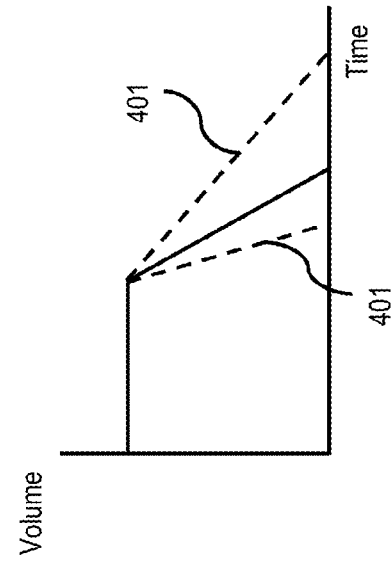

FIG. 4C illustrates control over the functionality of a device based on the rate of the change in the level of the ambient noise, audio information, and/or control signal. In one embodiment, the rate of the change in the volume of the music being played by a device controls, for example, the fast forward rate of the song. By way of example, the solid, linear line illustrated in FIG. 4C corresponds to a rate that triggers the functionality of fast forwarding a song. In one embodiment, to activate the functionality of fast forwarding the song, the rate needs to be within a threshold range indicated by the dotted lines 401 to avoid decreases in the volume recorded in the music being played back from erroneously activating the functionality of fast forwarding the song. In one embodiment, similar rates of increasing the volume of the music being played by a device controls the fast forward rate of the song. In one embodiment, rates of increasing the music being played by a device controls one functionality and rates of decreasing the music being played by a device controls different functionality.

FIG. 4D illustrates control over the functionality of a device based on the pattern of the change in the level of the ambient noise, audio information, and/or control signal. Certain different patterns in the change of the level of the ambient noise, audio information, and/or control signal can correspond to different functions of the controlled device. In one embodiment, the pattern of muting the volume of the music being played by a device controls, for example, the number of songs that are skipped over in advancing to the next played song. Similarly, the pattern of increases in the volume of the music being played by a device controls, for example, the number of songs that are skipped over in advancing to the next played song. In one embodiment, the pattern of increases in the volume of the music being played by a device controls one functionality and the pattern of decreases in the volume of the music being played by a device controls a different functionality. In one embodiment, a threshold exists in the pattern of changes in the level of the ambient noise, audio information, and/or control signal so that certain common patterns in music do not erroneously execute functionality of a device. By way of example, the dotted line 403 represents a threshold of at least two reductions in the level of the volume of ambient noise prior to a determination to correlate a pattern in the reduction of the ambient noise to a functionality of a controlled device.

Figure 4E:
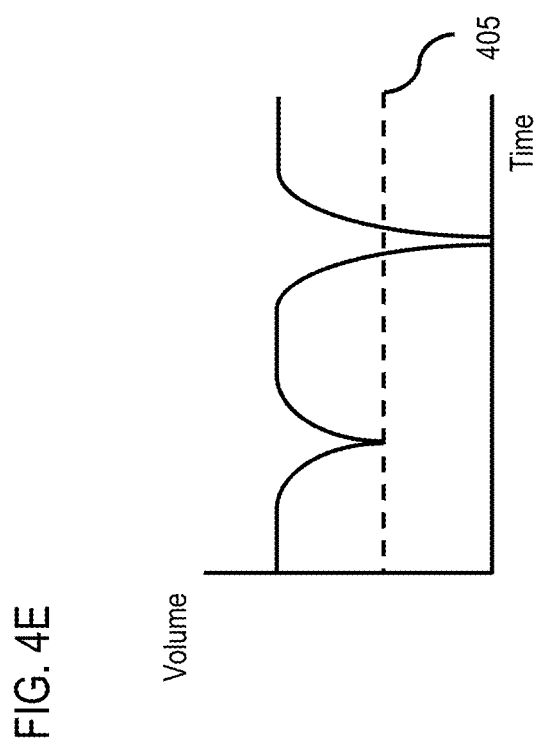

FIG. 4E illustrates control over the functionality of a device based on the degree of the change in the level of the ambient noise, audio information, and/or control signal. Certain different degrees in the change of the level of the ambient noise, audio information, and/or control signal can correspond to different functionalities. By way of example, the dotted line 405 indicates one threshold in the degree of the change in the level of the ambient noise, audio information, and/or control signal. A drop in the level of, for example, the control signal to the threshold degree corresponds to a certain functionality, such as pausing the music being played by the device. A drop in the level of the control signal to below the threshold degree corresponds to a different functionality. Similarly, an increase in the level of, for example, the control signal to a threshold degree could correspond to a certain functionality, such as limiting the increase in the volume of music being played by the device to reduce hearing damage.

Figure 5A:
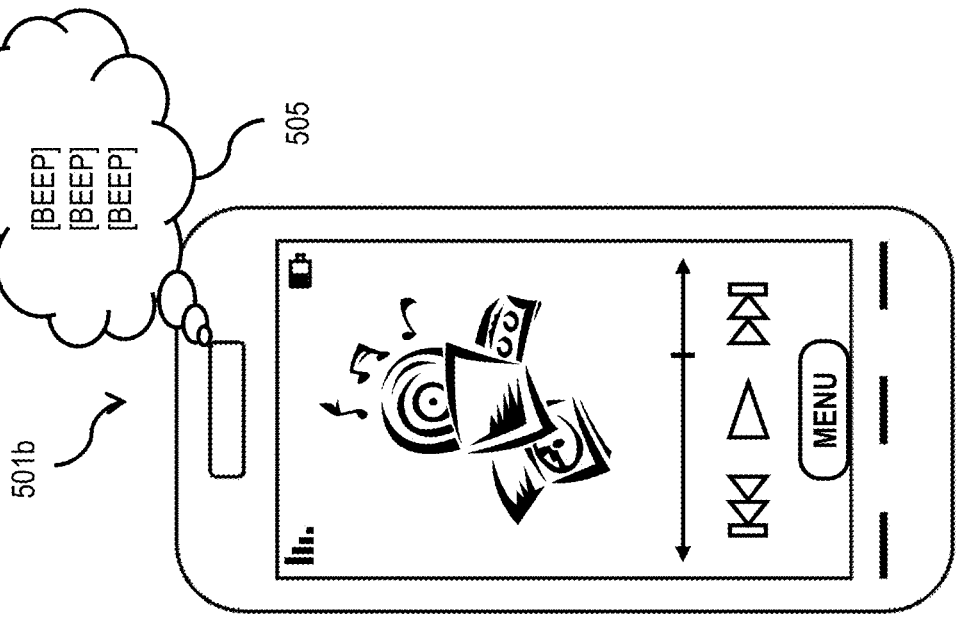
Figure 5B:
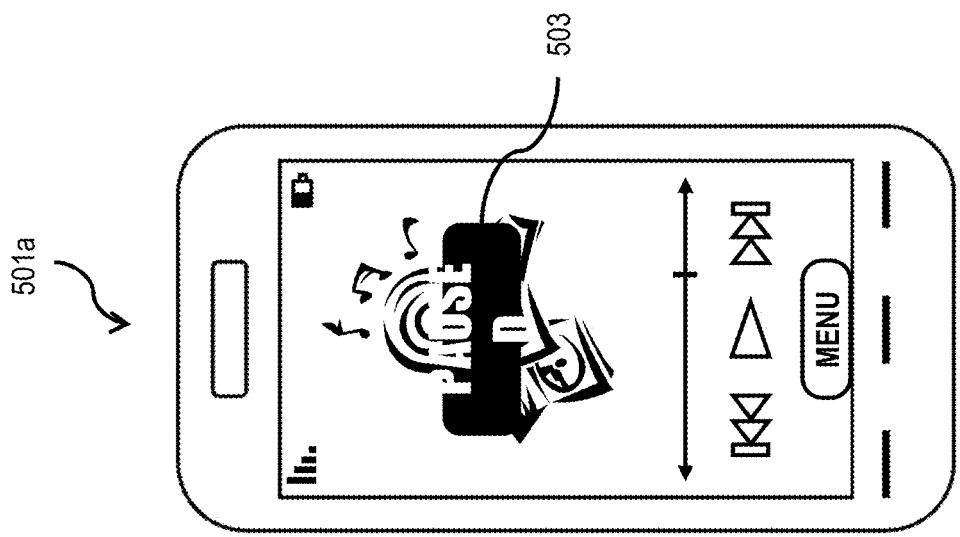

FIGS. 5A-5D are diagrams of user interfaces utilized in the processes of FIGS. 3A and 3B, according to various embodiments. FIG. 5A illustrates the user interface 501a of a UE 101 as the controlled device with a visual indication 503 of the execution of at least one function. By way of example, the indication 503 indicates that music being played by the UE 101 was paused in accordance with the change in the level of the ambient noise, audio information, control signal, or a combination thereof. The indication 503 can correspond to a format of an indication already programmed in the UE 101, or a format of an indication sent from the control platform 103 to the UE 101. FIG. 5B illustrates a user interface 501b of the UE 101 as the controlled device without a visual indication. Instead, the visual indication is replaced with an audio indication in the form of a set number of beeps 505. The number of beeps 505 can correspond to a specific function that was executed by the UE 101. FIG. 5C illustrates a user interface 501c including a visual indication 507 of the execution of at least one function. By way of example, the indication 507 indicates that the ringer volume was adjusted based on the change in the level of the ambient noise near the UE 101. FIG. 5D illustrates a user interface 501d including a visual indication 509 of the execution of a function to turn off the ringer and turn on the vibrator in response to a change in the level of the ambient noise near the UE 101. For example, the level of noise exceeded a certain threshold so that the user of the UE 101 would likely be unable to hear the ringer upon receiving an incoming phone call. Thus, by turning the ringer off and turning the vibrator on, the user is able to detect the presence of the incoming phone call by the UE 101 vibrating.

The processes described herein for providing audio-based control may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 6:
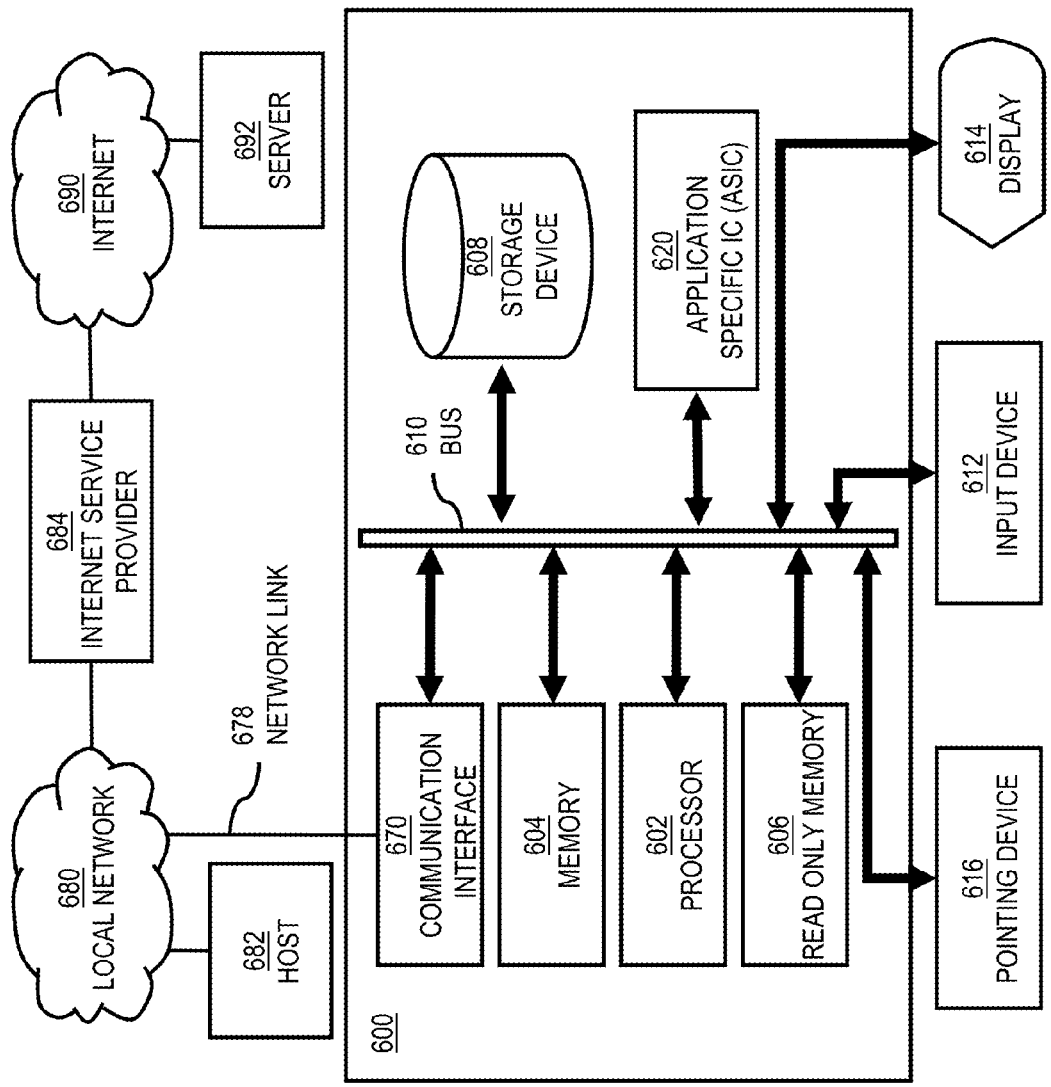
FIG. 6 is a diagram of hardware that can be used to implement an embodiment of the invention.

FIG. 6 illustrates a computer system 600 upon which an embodiment of the invention may be implemented. Although computer system 600 is depicted with respect to a particular device or equipment, it is contemplated that other devices or equipment (e.g., network elements, servers, etc.) within FIG. 6 can deploy the illustrated hardware and components of system 600. Computer system 600 is programmed (e.g., via computer program code or instructions) to provide audio-based control as described herein and includes a communication mechanism such as a bus 610 for passing information between other internal and external components of the computer system 600. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 600, or a portion thereof, constitutes a means for performing one or more steps of providing audio-based control.

A bus 610 includes one or more parallel conductors of information so that information is transferred quickly among devices coupled to the bus 610. One or more processors 602 for processing information are coupled with the bus 610.

A processor (or multiple processors) 602 performs a set of operations on information as specified by computer program code related to provide audio-based control. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 610 and placing information on the bus 610. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 602, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 600 also includes a memory 604 coupled to bus 610. The memory 604, such as a random access memory (RAM) or any other dynamic storage device, stores information including processor instructions for providing audio-based control. Dynamic memory allows information stored therein to be changed by the computer system 600. RAM allows a unit of information stored at a location called a memory address to be stored and retrieved independently of information at neighboring addresses. The memory 604 is also used by the processor 602 to store temporary values during execution of processor instructions. The computer system 600 also includes a read only memory (ROM) 606 or any other static storage device coupled to the bus 610 for storing static information, including instructions, that is not changed by the computer system 600. Some memory is composed of volatile storage that loses the information stored thereon when power is lost. Also coupled to bus 610 is a non-volatile (persistent) storage device 608, such as a magnetic disk, optical disk or flash card, for storing information, including instructions, that persists even when the computer system 600 is turned off or otherwise loses power.

Information, including instructions for providing audio-based control, is provided to the bus 610 for use by the processor from an external input device 612, such as a keyboard containing alphanumeric keys operated by a human user, a microphone, an Infrared (IR) remote control, a joystick, a game pad, a stylus pen, a touch screen, or a sensor. A sensor detects conditions in its vicinity and transforms those detections into physical expression compatible with the measurable phenomenon used to represent information in computer system 600. Other external devices coupled to bus 610, used primarily for interacting with humans, include a display device 614, such as a cathode ray tube (CRT), a liquid crystal display (LCD), a light emitting diode (LED) display, an organic LED (OLED) display, a plasma screen, or a printer for presenting text or images, and a pointing device 616, such as a mouse, a trackball, cursor direction keys, or a motion sensor, for controlling a position of a small cursor image presented on the display 614 and issuing commands associated with graphical elements presented on the display 614. In some embodiments, for example, in embodiments in which the computer system 600 performs all functions automatically without human input, one or more of external input device 612, display device 614 and pointing device 616 is omitted.

In the illustrated embodiment, special purpose hardware, such as an application specific integrated circuit (ASIC) 620, is coupled to bus 610. The special purpose hardware is configured to perform operations not performed by processor 602 quickly enough for special purposes. Examples of ASICs include graphics accelerator cards for generating images for display 614, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 600 also includes one or more instances of a communications interface 670 coupled to bus 610. Communication interface 670 provides a one-way or two-way communication coupling to a variety of external devices that operate with their own processors, such as printers, scanners and external disks. In general the coupling is with a network link 678 that is connected to a local network 680 to which a variety of external devices with their own processors are connected. For example, communication interface 670 may be a parallel port or a serial port or a universal serial bus (USB) port on a personal computer. In some embodiments, communications interface 670 is an integrated services digital network (ISDN) card or a digital subscriber line (DSL) card or a telephone modem that provides an information communication connection to a corresponding type of telephone line. In some embodiments, a communication interface 670 is a cable modem that converts signals on bus 610 into signals for a communication connection over a coaxial cable or into optical signals for a communication connection over a fiber optic cable. As another example, communications interface 670 may be a local area network (LAN) card to provide a data communication connection to a compatible LAN, such as Ethernet. Wireless links may also be implemented. For wireless links, the communications interface 670 sends or receives or both sends and receives electrical, acoustic or electromagnetic signals, including infrared and optical signals, that carry information streams, such as digital data. For example, in wireless handheld devices, such as mobile telephones like cell phones, the communications interface 670 includes a radio band electromagnetic transmitter and receiver called a radio transceiver. In certain embodiments, the communications interface 670 enables connection to the communication network 105 for providing audio-based control to the UE 101.

The term "computer-readable medium" as used herein refers to any medium that participates in providing information to processor 602, including instructions for execution. Such a medium may take many forms, including, but not limited to computer-readable storage medium (e.g., non-volatile media, volatile media), and transmission media. Non-transitory media, such as non-volatile media, include, for example, optical or magnetic disks, such as storage device 608. Volatile media include, for example, dynamic memory 604. Transmission media include, for example, twisted pair cables, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, a carrier wave, or any other medium from which a computer can read. The term computer-readable storage medium is used herein to refer to any computer-readable medium except transmission media.

Logic encoded in one or more tangible media includes one or both of processor instructions on a computer-readable storage media and special purpose hardware, such as ASIC 620.

Network link 678 typically provides information communication using transmission media through one or more networks to other devices that use or process the information. For example, network link 678 may provide a connection through local network 680 to a host computer 682 or to equipment 684 operated by an Internet Service Provider (ISP). ISP equipment 684 in turn provides data communication services through the public, world-wide packet-switching communication network of networks now commonly referred to as the Internet 690.

A computer called a server host 692 connected to the Internet hosts a process that provides a service in response to information received over the Internet. For example, server host 692 hosts a process that provides information representing video data for presentation at display 614. It is contemplated that the components of system 600 can be deployed in various configurations within other computer systems, e.g., host 682 and server 692.

At least some embodiments of the invention are related to the use of computer system 600 for implementing some or all of the techniques described herein. According to one embodiment of the invention, those techniques are performed by computer system 600 in response to processor 602 executing one or more sequences of one or more processor instructions contained in memory 604. Such instructions, also called computer instructions, software and program code, may be read into memory 604 from another computer-readable medium such as storage device 608 or network link 678. Execution of the sequences of instructions contained in memory 604 causes processor 602 to perform one or more of the method steps described herein. In alternative embodiments, hardware, such as ASIC 620, may be used in place of or in combination with software to implement the invention. Thus, embodiments of the invention are not limited to any specific combination of hardware and software, unless otherwise explicitly stated herein.

The signals transmitted over network link 678 and other networks through communications interface 670, carry information to and from computer system 600. Computer system 600 can send and receive information, including program code, through the networks 680, 690 among others, through network link 678 and communications interface 670. In an example using the Internet 690, a server host 692 transmits program code for a particular application, requested by a message sent from computer 600, through Internet 690, ISP equipment 684, local network 680 and communications interface 670. The received code may be executed by processor 602 as it is received, or may be stored in memory 604 or in storage device 608 or any other non-volatile storage for later execution, or both. In this manner, computer system 600 may obtain application program code in the form of signals on a carrier wave.

Various forms of computer readable media may be involved in carrying one or more sequence of instructions or data or both to processor 602 for execution. For example, instructions and data may initially be carried on a magnetic disk of a remote computer such as host 682. The remote computer loads the instructions and data into its dynamic memory and sends the instructions and data over a telephone line using a modem. A modem local to the computer system 600 receives the instructions and data on a telephone line and uses an infrared transmitter to convert the instructions and data to a signal on an infrared carrier wave serving as the network link 678. An infrared detector serving as communications interface 670 receives the instructions and data carried in the infrared signal and places information representing the instructions and data onto bus 610. Bus 610 carries the information to memory 604 from which processor 602 retrieves and executes the instructions using some of the data sent with the instructions. The instructions and data received in memory 604 may optionally be stored on storage device 608, either before or after execution by the processor 602.

FIG. 7 illustrates a chip set or chip 700 upon which an embodiment of the invention may be implemented. Chip set 700 is programmed to provide audio-based control as described herein and includes, for instance, the processor and memory components described with respect to FIG. 6 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 700 can be implemented in a single chip. It is further contemplated that in certain embodiments the chip set or chip 700 can be implemented as a single "system on a chip." It is further contemplated that in certain embodiments a separate ASIC would not be used, for example, and that all relevant functions as disclosed herein would be performed by a processor or processors. Chip set or chip 700, or a portion thereof, constitutes a means for performing one or more steps of providing user interface navigation information associated with the availability of functions. Chip set or chip 700, or a portion thereof, constitutes a means for performing one or more steps of providing audio-based control.

In one embodiment, the chip set or chip 700 includes a communication mechanism such as a bus 701 for passing information among the components of the chip set 700. A processor 703 has connectivity to the bus 701 to execute instructions and process information stored in, for example, a memory 705. The processor 703 may include one or more processing cores with each core configured to perform independently. A multi-core processor enables multiprocessing within a single physical package. Examples of a multi-core processor include two, four, eight, or greater numbers of processing cores. Alternatively or in addition, the processor 703 may include one or more microprocessors configured in tandem via the bus 701 to enable independent execution of instructions, pipelining, and multithreading. The processor 703 may also be accompanied with one or more specialized components to perform certain processing functions and tasks such as one or more digital signal processors (DSP) 707, or one or more application-specific integrated circuits (ASIC) 709. A DSP 707 typically is configured to process real-world signals (e.g., sound) in real time independently of the processor 703. Similarly, an ASIC 709 can be configured to performed specialized functions not easily performed by a more general purpose processor. Other specialized components to aid in performing the inventive functions described herein may include one or more field programmable gate arrays (FPGA), one or more controllers, or one or more other special-purpose computer chips.

In one embodiment, the chip set or chip 700 includes merely one or more processors and some software and/or firmware supporting and/or relating to and/or for the one or more processors.

The processor 703 and accompanying components have connectivity to the memory 705 via the bus 701. The memory 705 includes both dynamic memory (e.g., RAM, magnetic disk, writable optical disk, etc.) and static memory (e.g., ROM, CD-ROM, etc.) for storing executable instructions that when executed perform the inventive steps described herein to provide audio-based control. The memory 705 also stores the data associated with or generated by the execution of the inventive steps.

Figure 8:
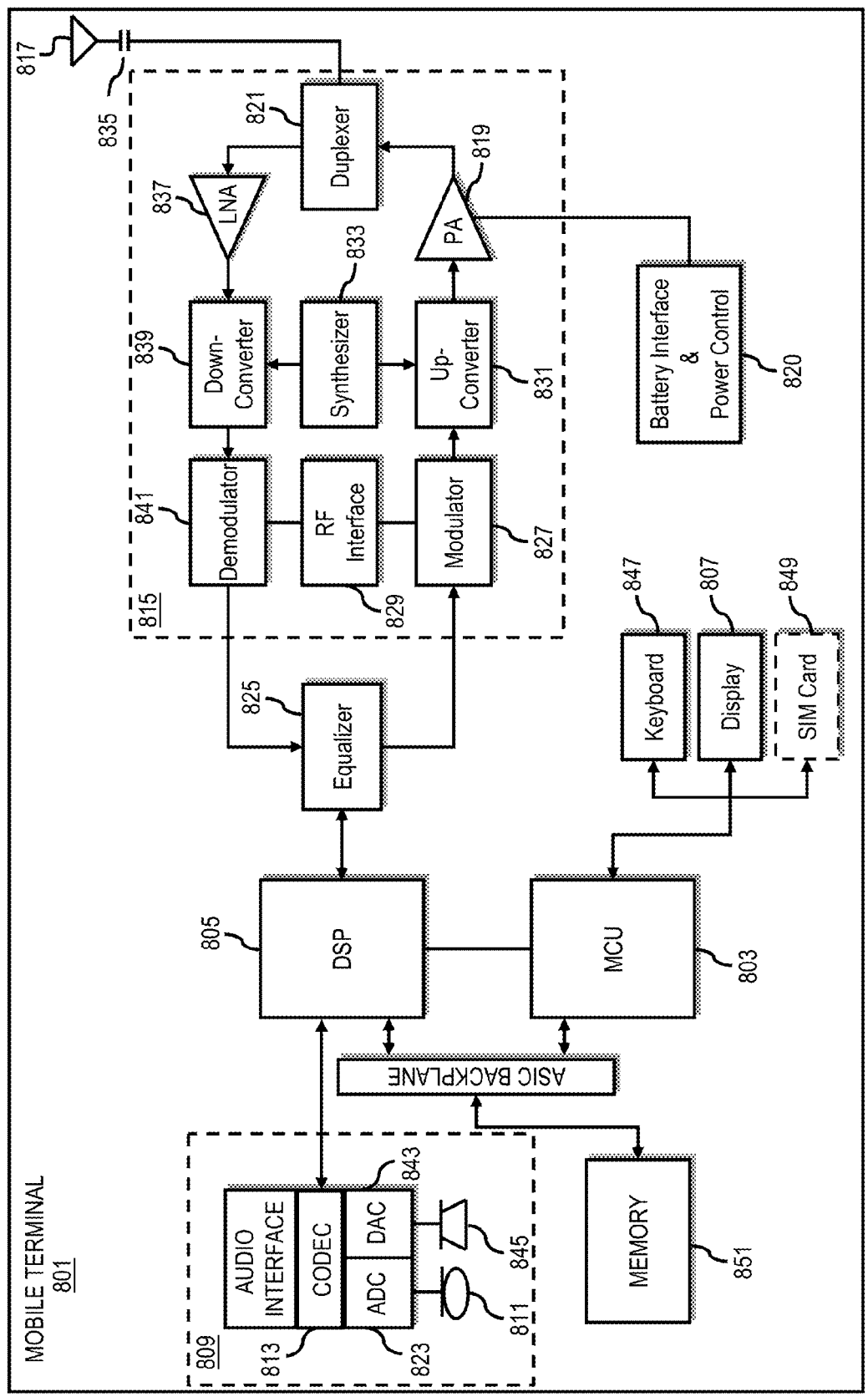
FIG. 8 is a diagram of a mobile terminal (e.g., handset) that can be used to implement an embodiment of the invention.

FIG. 8 is a diagram of exemplary components of a mobile terminal (e.g., handset) for communications, which is capable of operating in the system of FIG. 1, according to one embodiment. In some embodiments, mobile terminal 801, or a portion thereof, constitutes a means for performing one or more steps of providing audio-based control. Generally, a radio receiver is often defined in terms of front-end and back-end characteristics. The front-end of the receiver encompasses all of the Radio Frequency (RF) circuitry whereas the back-end encompasses all of the base-band processing circuitry. As used in this application, the term "circuitry" refers to both: (1) hardware-only implementations (such as implementations in only analog and/or digital circuitry), and (2) to combinations of circuitry and software (and/or firmware) (such as, if applicable to the particular context, to a combination of processor(s), including digital signal processor(s), software, and memory(ies) that work together to cause an apparatus, such as a mobile phone or server, to perform various functions). This definition of "circuitry" applies to all uses of this term in this application, including in any claims. As a further example, as used in this application and if applicable to the particular context, the term "circuitry" would also cover an implementation of merely a processor (or multiple processors) and its (or their) accompanying software/or firmware. The term "circuitry" would also cover if applicable to the particular context, for example, a baseband integrated circuit or applications processor integrated circuit in a mobile phone or a similar integrated circuit in a cellular network device or other network devices.

Pertinent internal components of the telephone include a Main Control Unit (MCU) 803, a Digital Signal Processor (DSP) 805, and a receiver/transmitter unit including a microphone gain control unit and a speaker gain control unit. A main display unit 807 provides a display to the user in support of various applications and mobile terminal functions that perform or support the steps of providing audio-based control. The display 807 includes display circuitry configured to display at least a portion of a user interface of the mobile terminal (e.g., mobile telephone). Additionally, the display 807 and display circuitry are configured to facilitate user control of at least some functions of the mobile terminal. An audio function circuitry 809 includes a microphone 811 and microphone amplifier that amplifies the speech signal output from the microphone 811. The amplified speech signal output from the microphone 811 is fed to a coder/decoder (CODEC) 813.

A radio section 815 amplifies power and converts frequency in order to communicate with a base station, which is included in a mobile communication system, via antenna 817. The power amplifier (PA) 819 and the transmitter/modulation circuitry are operationally responsive to the MCU 803, with an output from the PA 819 coupled to the duplexer 821 or circulator or antenna switch, as known in the art. The PA 819 also couples to a battery interface and power control unit 820.

In use, a user of mobile terminal 801 speaks into the microphone 811 and his or her voice along with any detected background noise is converted into an analog voltage. The analog voltage is then converted into a digital signal through the Analog to Digital Converter (ADC) 823. The control unit 803 routes the digital signal into the DSP 805 for processing therein, such as speech encoding, channel encoding, encrypting, and interleaving. In one embodiment, the processed voice signals are encoded, by units not separately shown, using a cellular transmission protocol such as enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), wideband code division multiple access (WCDMA), wireless fidelity (WiFi), satellite, and the like, or any combination thereof.

The encoded signals are then routed to an equalizer 825 for compensation of any frequency-dependent impairments that occur during transmission though the air such as phase and amplitude distortion. After equalizing the bit stream, the modulator 827 combines the signal with a RF signal generated in the RF interface 829. The modulator 827 generates a sine wave by way of frequency or phase modulation. In order to prepare the signal for transmission, an up-converter 831 combines the sine wave output from the modulator 827 with another sine wave generated by a synthesizer 833 to achieve the desired frequency of transmission. The signal is then sent through a PA 819 to increase the signal to an appropriate power level. In practical systems, the PA 819 acts as a variable gain amplifier whose gain is controlled by the DSP 805 from information received from a network base station. The signal is then filtered within the duplexer 821 and optionally sent to an antenna coupler 835 to match impedances to provide maximum power transfer. Finally, the signal is transmitted via antenna 817 to a local base station. An automatic gain control (AGC) can be supplied to control the gain of the final stages of the receiver. The signals may be forwarded from there to a remote telephone which may be another cellular telephone, any other mobile phone or a land-line connected to a Public Switched Telephone Network (PSTN), or other telephony networks.

Voice signals transmitted to the mobile terminal 801 are received via antenna 817 and immediately amplified by a low noise amplifier (LNA) 837. A down-converter 839 lowers the carrier frequency while the demodulator 841 strips away the RF leaving only a digital bit stream. The signal then goes through the equalizer 825 and is processed by the DSP 805. A Digital to Analog Converter (DAC) 843 converts the signal and the resulting output is transmitted to the user through the speaker 845, all under control of a Main Control Unit (MCU) 803 which can be implemented as a Central Processing Unit (CPU).

The MCU 803 receives various signals including input signals from the keyboard 847. The keyboard 847 and/or the MCU 803 in combination with other user input components (e.g., the microphone 811) comprise a user interface circuitry for managing user input. The MCU 803 runs a user interface software to facilitate user control of at least some functions of the mobile terminal 801 to provide audio-based control. The MCU 803 also delivers a display command and a switch command to the display 807 and to the speech output switching controller, respectively. Further, the MCU 803 exchanges information with the DSP 805 and can access an optionally incorporated SIM card 849 and a memory 851. In addition, the MCU 803 executes various control functions required of the terminal. The DSP 805 may, depending upon the implementation, perform any of a variety of conventional digital processing functions on the voice signals. Additionally, DSP 805 determines the background noise level of the local environment from the signals detected by microphone 811 and sets the gain of microphone 811 to a level selected to compensate for the natural tendency of the user of the mobile terminal 801.

The CODEC 813 includes the ADC 823 and DAC 843. The memory 851 stores various data including call incoming tone data and is capable of storing other data including music data received via, e.g., the global Internet. The software module could reside in RAM memory, flash memory, registers, or any other form of writable storage medium known in the art. The memory device 851 may be, but not limited to, a single memory, CD, DVD, ROM, RAM, EEPROM, optical storage, magnetic disk storage, flash memory storage, or any other non-volatile storage medium capable of storing digital data.

An optionally incorporated SIM card 849 carries, for instance, important information, such as the cellular phone number, the carrier supplying service, subscription details, and security information. The SIM card 849 serves primarily to identify the mobile terminal 801 on a radio network. The card 849 also contains a memory for storing a personal telephone number registry, text messages, and user specific mobile terminal settings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method comprising facilitating a processing of (1) data and/or (2) information and/or (3) at least one signal, the (1) data and/or (2) information and/or (3) at least one signal based, at least in part, on the following:
    a transmission of audio information from at least one device to an audio playback assembly for rendering;
    a determination of at least one indication of a change in the rendering, wherein the at least one indication is based, at least in part, on one or more controls associated with the audio playback assembly; and
    a processing of the at least one indication to cause, at least in part, an execution of at least one function for controlling the rendering of the audio information,
    wherein the rendering includes at least one control signal included in the audio information, and wherein the at least one indication is based, at least in part, on a change in a level of the at least one control signal.

2. A method of claim 1, wherein the at least one control signal is generated continuously, periodically, or a combination thereof.

3. A method of claim 1, wherein the at least one control signal is inaudible to humans.

4. A method of claim 1, wherein the (1) data and/or (2) information and/or (3) at least one signal are further based, at least in part, on the following:
    a generation of at least one audio signal upon the execution of the at least one function.

5. A method of claim 1, wherein the (1) data and/or (2) information and/or (3) at least one signal are further based, at least in part, on the following:
    a processing of the rendering to determine a duration, a degree, a rate, a pattern, or a combination thereof of the at least one indication; and
    at least one determination of the at least one function based, at least in part, on the duration, the degree, the rate, the pattern, or the combination thereof.

6. A method of claim 1, wherein the (1) data and/or (2) information and/or (3) at least one signal are further based, at least in part, on the following:
an audio indication, a visual indication, a mechanical indication, or a combination thereof of the execution of the at least one function.

7. A method of claim 1, wherein the determination of the at least one indication is continuous, periodic, or a combination thereof.

8. A method of claim 1, wherein the at least one indication is received via at least one loudspeaker assembly.

9. A method of claim 1, wherein the one or more controls determine one or more characteristics of the at least one indication, the rendering, or a combination thereof.

10. An apparatus comprising:
at least one processor; and
at least one memory including computer program code for one or more programs,
the at least one memory and the computer program code configured to, with the at least one processor, cause the apparatus to perform at least the following,
cause, at least in part, a transmission of audio information from at least one device to an audio playback assembly for rendering;
determine at least one indication of a change in the rendering, wherein the at least one indication is based, at least in part, on one or more controls associated with the audio playback assembly; and
process and/or facilitate a processing of the at least one indication to cause, at least in part, an execution of at least one function for controlling the rendering of the audio information,
wherein the rendering includes at least one control signal included in the audio information, and wherein the at least one indication is based, at least in part, on a change in a level of the at least one control signal.

11. An apparatus of claim 10, wherein the at least one control signal is generated continuously, periodically, or a combination thereof.

12. An apparatus of claim 10, wherein the at least one control signal is inaudible to humans.

13. An apparatus of claim 10, wherein the apparatus is further caused to:
cause, at least in part, a generation of at least one audio signal upon the execution of the at least one function.

14. An apparatus of claim 10, wherein the apparatus is further caused to:
process and/or facilitate a processing of the rendering to determine a duration, a degree, a rate, a pattern, or a combination thereof of the at least one indication; and
determine the at least one function based, at least in part, on the duration, the degree, the rate, the pattern, or the combination thereof.

15. An apparatus of claim 10, wherein the apparatus is further caused to:
cause, at least in part, an audio indication, a visual indication, a mechanical indication, or a combination thereof of the execution of the at least one function.

16. An apparatus of claim 10, wherein the determining of the at least one indication is continuous, periodic, or a combination thereof.

17. An apparatus of claim 10, wherein the at least one indication is received via at least one loudspeaker assembly.

18. An apparatus of claim 10, wherein the one or more controls determine one or more characteristics of the at least one indication, the rendering, or a combination thereof.

* * * * *